United States Patent
Wendell et al.

(10) Patent No.: US 7,084,671 B1
(45) Date of Patent: Aug. 1, 2006

(54) SENSE AMPLIFIER AND METHOD FOR MAKING THE SAME

(75) Inventors: Dennis Wendell, Sunnyvale, CA (US); Howard L. Levy, Cedar Park, TX (US); Jin-Uk Shin, San Jose, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/765,311

(22) Filed: Jan. 26, 2004

(51) Int. Cl.
*H03F 3/45* (2006.01)

(52) U.S. Cl. .............................. 327/51; 327/52; 327/55; 327/57

(58) Field of Classification Search .................. 327/51, 327/55; 365/189.04, 189.05, 189.06, 189.09, 365/189.11
See application file for complete search history.

(56) References Cited

U.S. PATENT DOCUMENTS 3,879,621 A * 4/1975 Cavaliere et al. ............. 327/57
5,455,798 A * 10/1995 McClure ....................... 365/200
5,455,802 A * 10/1995 McClure ....................... 365/233
5,485,430 A * 1/1996 McClure ....................... 365/233
6,275,435 B1 * 8/2001 Su et al. ........................ 365/207

* cited by examiner

*Primary Examiner*—Tuan T. Lam
*Assistant Examiner*—Hiep Nguyen
(74) *Attorney, Agent, or Firm*—Martine Penilla & Gencarella, LLP

(57) ABSTRACT

A Negative Bias Temperature Instability (NBTI) tolerant sense amplifier is provided. The sense amplifier includes an input stage having a pair of balanced isolation devices. Each of the balanced isolation devices has an input connected to receive a separate one of a pair of differential input signals. Each of the balanced isolation devices also has a gate that is connected to receive a common bias voltage. The sense amplifier further includes a sense stage connected to the input stage. The sense stage is configured to receive and amplify a higher signal to be provided by the pair of balanced isolation devices. The sense amplifier is also equipped to operate a low voltage levels.

22 Claims, 3 Drawing Sheets

SENSE AMPLIFIER AND METHOD FOR MAKING THE SAME

BACKGROUND OF THE INVENTION

1. Field of the Invention

The present invention relates generally to sense amplifier circuitry.

2. Description of the Related Art

Sense amplifiers are often used to detect and amplify a data signal present on a differential pair of data lines. For example, a sense amplifier can be used to detect a higher signal present on a differential pair of data lines, amplify the higher signal, and output the amplified signal for processing by other circuitry. Sense amplifiers are commonly used in this manner to discriminate between signals present on complementary bitlines of memory cell arrays.

FIG. 1 is an illustration showing a conventional current mode sense amplifier, in accordance with the prior art. The conventional sense amplifier includes input nodes 101 and 103 that are connected to receive a differential pair of input signals. Input nodes 101 and 103 are also connected to an output of PMOS devices 105 and 107, respectively. The inputs of PMOS device 105 and 107 are connected to a supply voltage. The gates of PMOS devices 105 and 107 are connected to ground. Thus, PMOS devices 105 and 107 are always transmitting from the supply voltage to the input nodes 101 and 103, respectively.

The conventional sense amplifier also includes two PMOS devices 109 and 111 that have their inputs connected to input nodes 101 and 103, respectively. The outputs of PMOS devices 109 and 111 are connected to sense nodes 113 and 115, respectively. Also, a gate of PMOS device 109 is connected to the output of PMOS device 111. Conversely, a gate of PMOS device 111 is connected to the output of PMOS device 109. In this manner, PMOS devices 109 and 111 are cross-coupled. Thus, PMOS devices 109 and 111 serve to provide positive feedback to each other.

The conventional sense amplifier further includes two NMOS devices 117 and 119 that have their inputs connected to sense nodes 113 and 115, respectively. The outputs of NMOS devices 117 and 119 are connected to ground. Also, a gate of NMOS device 117 is connected to an input of NMOS device 119. Conversely, a gate of NMOS device 119 is connected to an input of NMOS device 117. Hence, NMOS devices 117 and 119 are cross-coupled. Therefore, NMOS devices 109 and 111 serve to provide positive feedback to each other.

The conventional sense amplifier further includes an NMOS device 121 having a first terminal connected to the sense node 113 and a second terminal connected to the sense node 115. Prior to performing a sensing operation, the NMOS device 121 is controlled to transmit such that sense nodes 113 and 115 are afforded an opportunity to equalize. During the sensing operation, the NMOS device 121 is controlled to isolate sense nodes 113 and 115 from each other. Thus, prior to performing the sensing operation, sense nodes 113 and 115 are intended to maintain an equal voltage. Then, during the sensing operation, input nodes 101 and 103 will be influenced by the incoming differential pair of input signals such that either input node 101 or 103 will begin to attain a lower state. If the input node 101 begins to attain a lower state relative to the input node 103, the output of PMOS device 111 will become greater, thus causing transmission of PMOS device 109 to decrease. In following, a decrease in the transmission of PMOS device 109 causes transmission of the PMOS device 111 to increase further. If the input node 103 begins to attain a lower state relative to the input node 101, the PMOS devices 109 and 11 will operate in a complementary manner relative to that previously described with respect to the input node 101 attaining the lower state. Also, during the sensing operation, as either sense node 113 or 115 begins to attain a higher state, transmission through either NMOS device 119 or 117, respectively, will begin to increase. Thus, as either sense node 113 or 115 begins to attain a higher state, the other sense node will be pulled to ground. Therefore, a higher signal on input node 101 relative to input node 103 will cause sense node 113 to attain a high state and sense node 115 to attain a low state, vice-versa.

The conventional sense amplifier as described with respect to FIG. 1, however, is vulnerable to a number of adverse effects and limitations. One such adverse effect is associated with Negative Bias Temperature Instability (NBTI). NBTI is a deep submicron technology phenomena that causes a threshold voltage of a PMOS device to increase over time. NBTI effects are influenced by gate-to-source bias conditions and temperature during the silicon lifetime of the PMOS device. With respect to the conventional sense amplifier, the increase in threshold voltage of PMOS devices resulting from NBTI impacts at least two aspects of circuit performance. In one aspect, the increase in threshold voltage reduces the driving capability of the PMOS devices, thus delaying the conventional sense amplifier circuit operation. In another aspect, since NBTI effects are influenced by gate-to-source bias conditions, one of the cross-coupled PMOS devices 109 and 111, with respect to FIG. 1, will necessarily experience different NBTI effects relative to the other. Thus, the increase in threshold voltage caused by NBTI will be uneven between PMOS devices 109 and 111. A threshold voltage imbalance between PMOS devices 109 and 111 requires longer signal development time to overcome the imbalance, thus further delaying the conventional sense amplifier circuit operation. Also, as technology evolves to more aggressive supply voltage levels, NBTI induced threshold voltage shifts will become even more significant, leading to intolerable conventional sense amplifier performance penalties.

Another limitation of the convention sense amplifier of FIG. 1 is associated with low voltage operability. The lowest voltage at which the conventional sense amplifier can operate is determined by the threshold voltage of NMOS device 121. The gate bias of NMOS device 121 needs to be greater than two times its the threshold voltage to achieve equilibrium between sense nodes 113 and 115. Typical threshold voltages for NMOS devices are within a range extending from about 300 mV to about 350 mV. Thus, NMOS device 121 requires a substantial gate bias to equalize sense nodes 113 and 115. Also, the sense nodes 113 and 115 must be equalized well for the conventional sense amplifier to operate at low voltages.

In view of the foregoing, there is a need for a current mode sense amplifier that is tolerant to NBTI effects and is capable of operating at lower voltage levels.

SUMMARY OF THE INVENTION

Broadly speaking, the present invention provides a sense amplifier for detecting and amplifying a high signal within a differential pair of signals. More specifically, the present invention provides a latch-type current-mode sense amplifier that is tolerant to Negative Bias Temperature Instability (NBTI) effects and is capable of operating a low voltage. For ease of discussion, the latch-type current-mode sense amplifier of the present invention will be referred to as "sense amplifier." The sense amplifier features an input stage having two PMOS devices that are each connected to receive separate signals of a differential pair of input signals, wherein both of the PMOS devices have commonly biased gates. The common gate biasing of the two input stage PMOS devices essentially eliminates an unbalanced threshold voltage ($V_{th}$) shift resulting from NBTI. In conjunction with the input stage PMOS devices, the sense amplifier also incorporates a pair of PMOS devices in a sense stage to drive a pair of sensing nodes, respectively. A gate of each sense stage PMOS device is connected to receive positive feedback from the sensing node to which the same PMOS device is connected. Furthermore, the sense amplifier features an equalization PMOS device within the sense stage to assist in equalization of the pair of sensing nodes prior to performing a sensing operation. The equalization PMOS device improves equalization of the pair of sensing nodes at lower voltages. Thus, the equalization PMOS device enables use of the sense amplifier at lower voltages.

In one embodiment, a sense amplifier is disclosed. The sense amplifier includes an input stage having a pair of balanced isolation devices. Each of the balanced isolation devices has an input connected to receive a separate one of a pair of differential input signals. Each of the balanced isolation devices also has a gate that is connected to receive a common bias voltage. The sense amplifier further includes a sense stage connected to the input stage. The sense stage is configured to receive and amplify a higher signal to be provided by the pair of balanced isolation devices.

In another embodiment, a sense amplifier is disclosed. The sense amplifier includes a pair of input nodes. Each of the pair of input nodes is connected to receive a separate one of a pair of differential input signals. The sense amplifier also includes a pair of balanced isolation devices that each has an input connected to a separate one of the pair of input nodes. Each of the pair of balanced isolation devices has a gate connected to receive a common bias voltage. Also, each of the pair of balanced isolation devices has an output representing a separate one of a pair of sense nodes. The sense amplifier further includes a transmission gate disposed between the pair of sense nodes. The transmission gate is configured to control conduction between the pair of sense nodes. Additionally, the sense amplifier includes pull down logic connected to the pair of sense nodes.

In yet another embodiment, a method for making a sense amplifier is disclosed. The method includes connecting a pair of input nodes to each receive a separate one of a pair of differential input signals. An input of each of a pair of balanced isolation devices is connected to a separate one of the pair of input nodes. Each of the pair of balanced isolation devices has an output representing a separate one of a pair of sense nodes. Additionally, a gate of each of the pair of balanced isolation devices is connected to receive a common bias voltage. The method continues with connecting each of a first terminal and a second terminal of a transmission gate to a separate one of the pair of sense nodes. Also, the method includes connecting pull down circuitry to the pair of sense nodes.

Other aspects of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION

The present invention provides a sense amplifier for detecting and amplifying a high signal within a differential pair of signals. More specifically, the present invention provides a latch-type current-mode sense amplifier that is tolerant to Negative Bias Temperature Instability (NBTI) effects and is capable of operating a low voltage. For ease of discussion, the latch-type current-mode sense amplifier of the present invention will be referred to as "sense amplifier." The sense amplifier features an input stage having two PMOS devices that are each connected to receive separate signals of a differential pair of input signals, wherein both of the PMOS devices have commonly biased gates. The common gate biasing of the two input stage PMOS devices essentially eliminates an unbalanced threshold voltage ($V_{th}$) shift resulting from NBTI. In conjunction with the input stage PMOS devices, the sense amplifier also incorporates a pair of PMOS devices in a sense stage to drive a pair of sensing nodes, respectively. A gate of each sense stage PMOS device is connected to receive positive feedback from the sensing node to which the same PMOS device is connected. Furthermore, the sense amplifier features an equalization PMOS device within the sense stage to assist in equalization of the pair of sensing nodes prior to performing a sensing operation. The equalization PMOS device improves equalization of the pair of sensing nodes at lower voltages. Thus, the equalization PMOS device enables use of the sense amplifier at lower voltages.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

It should be appreciated that the present invention can be implemented in numerous ways, including as a process, an apparatus, a system, a device, or a method. Several exemplary embodiments of the invention will now be described in detail with reference to the accompanying drawings.

Figure 1:
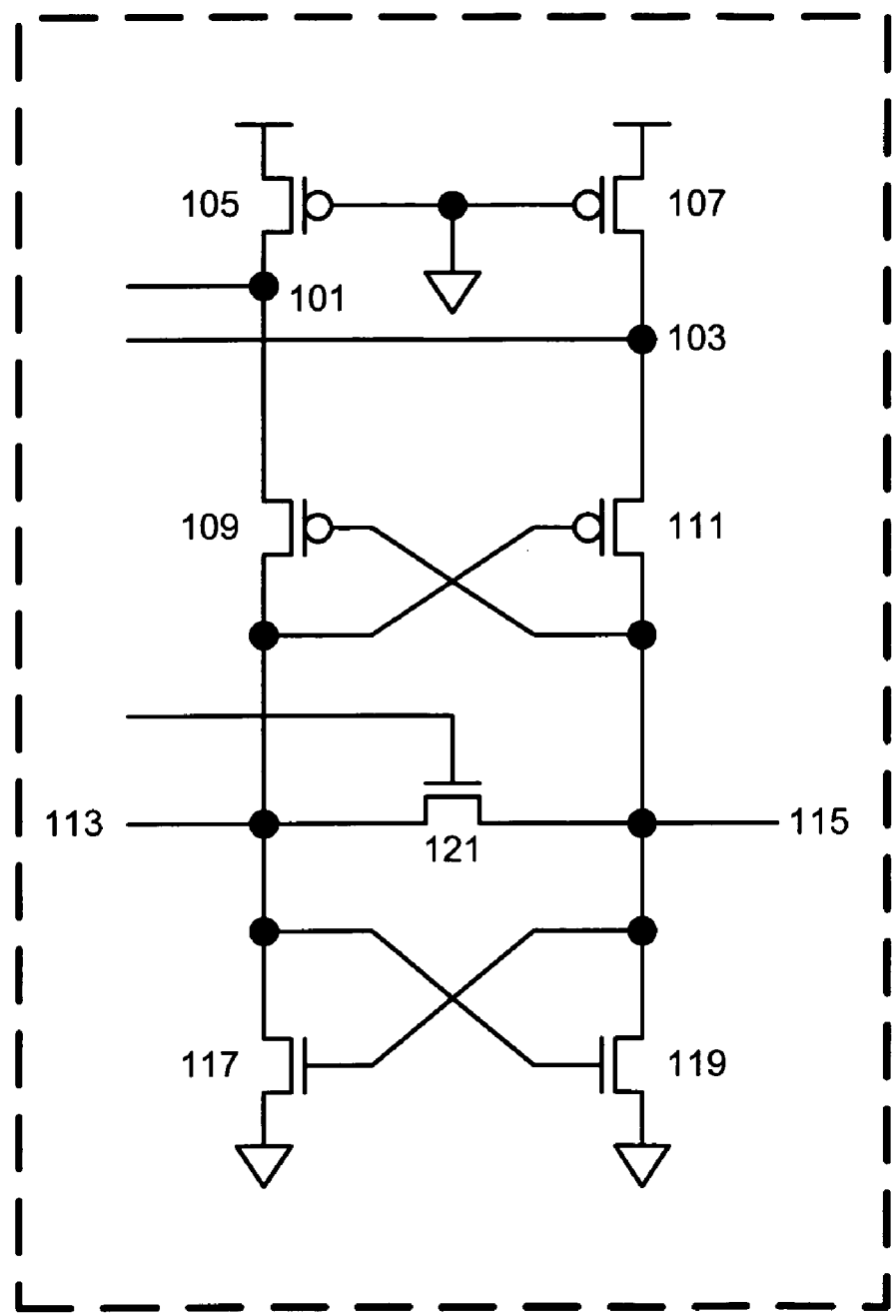
FIG. 1 is an illustration showing a conventional current mode sense amplifier, in accordance with the prior art.
Figure 2A:
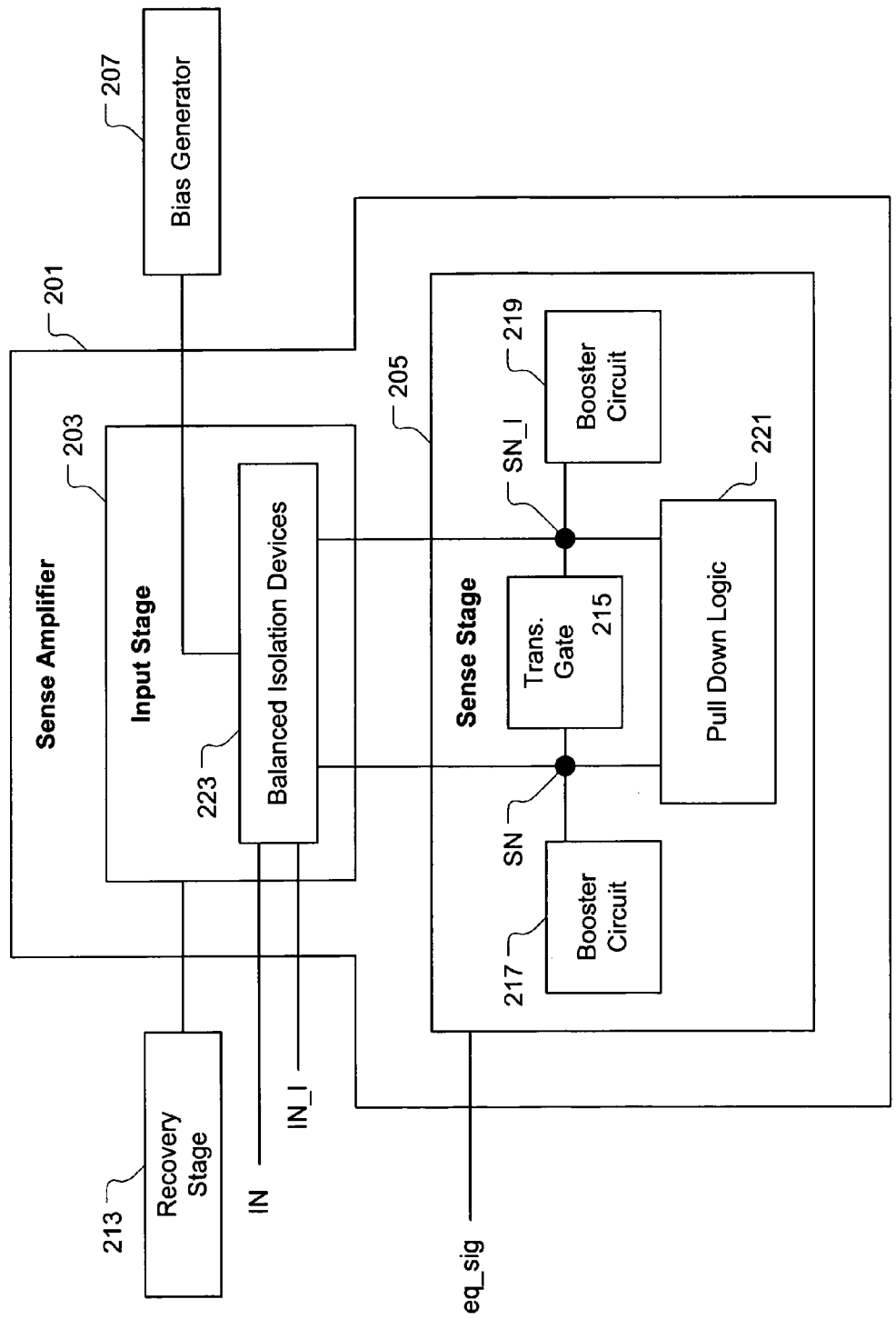
FIG. 2A is an illustration showing a sense amplifier, in accordance with one embodiment of the present invention.

FIG. 2A is an illustration showing a sense amplifier 201, in accordance with one embodiment of the present invention. The sense amplifier 201 represents a latch-type current-mode sense amplifier that is capable of detecting and amplifying a high signal within a differential pair of input signals IN and IN_1. In various embodiments, the differential pair of input signals IN and IN_1 can represent signals carried on bitlines or matchlines of memory devices. The sense amplifier 201 can be used with either DRAM (dynamic random access memory), SRAM (static RAM), or CAM (content addressable memory) devices, among others. It should be appreciated, however, that the sense amplifier 201 can be implemented in any circuit wherever a high signal within a differential pair of signals needs to be detected and amplified.

The sense amplifier 201 includes an input stage 203 having a pair of balanced isolation devices 223. Each of the pair of balanced isolation devices 223 has an input connected to receive a separate one of the pair of differential input signals IN and IN_1. Also, each of the pair of balanced isolation devices 223 has a gate connected to receive a common bias voltage from a bias generator circuit 207. In one embodiment, the gates of the pair of balanced isolation devices 223 are connected together to receive the common bias voltage. Additionally, in one embodiment, the input stage 203 is connected to a recovery stage 213. The recovery stage 213 is configured to assist in recharging and equalizing the inputs of the pair of balanced isolation devices 223 prior to receiving the pair of differential input signals IN and IN_1.

The sense amplifier 201 further includes a sense stage 205 connected to the input stage 203. The sense stage 205 is configured to receive and amplify a higher signal to be provided by the pair of balanced isolation devices 223. The sense stage 205 includes a pair of sense nodes SN and SN_1. Each of the pair of sense nodes SN and SN_1 is connected to an output of a separate one of the pair of balanced isolation devices 223. The sense stage 205 also includes a transmission gate 215 disposed between the pair of sense nodes SN and SN_1. The transmission gate 215 is configured to control electrical conduction between the pair of sense nodes SN and SN_1. Also, the transmission gate 215 is configured to operate in response to an equalization control signal eq_sig. More specifically, prior to performing a sensing operation, the equalization control signal eq_sig is defined to cause transmission gate 215 to allow conduction between sense nodes SN and SN_1. In this manner, the sense nodes SN and SN_1 are allowed to equalize prior to performing the sensing operation. During the sensing operation, the equalization control signal eq_sig is defined to cause transmission gate 215 to not allow conduction between sense nodes SN and SN_1. In this manner, the sense nodes SN and SN_1 are isolated from each other with respect to transmission gate 215.

The sense stage 205 also includes a pair of booster circuits 217 and 219 connected to sense nodes SN and SN_1, respectively. The pair of booster circuits 217 and 219 are configured to assist in a low-to-high state transition of the sense nodes SN and SN_1, respectively. As with the transmission gate 215, each of the pair of booster circuits 217 and 219 are also configured to operate in response to the equalization control signal eq_sig. Prior to performing the sensing operation, the booster circuits 217 and 219 are inactive. During the sensing operation, the booster circuits 217 and 219 are configured to provide positive feedback to the sense nodes SN and SN_1, respectively, during a low-to-high state transition.

The sense stage 205 further includes pull down logic 221 connected to sense nodes SN and SN_1. The pull down logic 221 is configured to assist in a high-to-low state transition of either sense node SN or SN_1. More specifically, as one of sense nodes SN and SN_1 begins to attain a higher state relative to the other sense node, the pull down logic assists in further decreasing a voltage level of the sense node having the lower state.

Figure 2B:
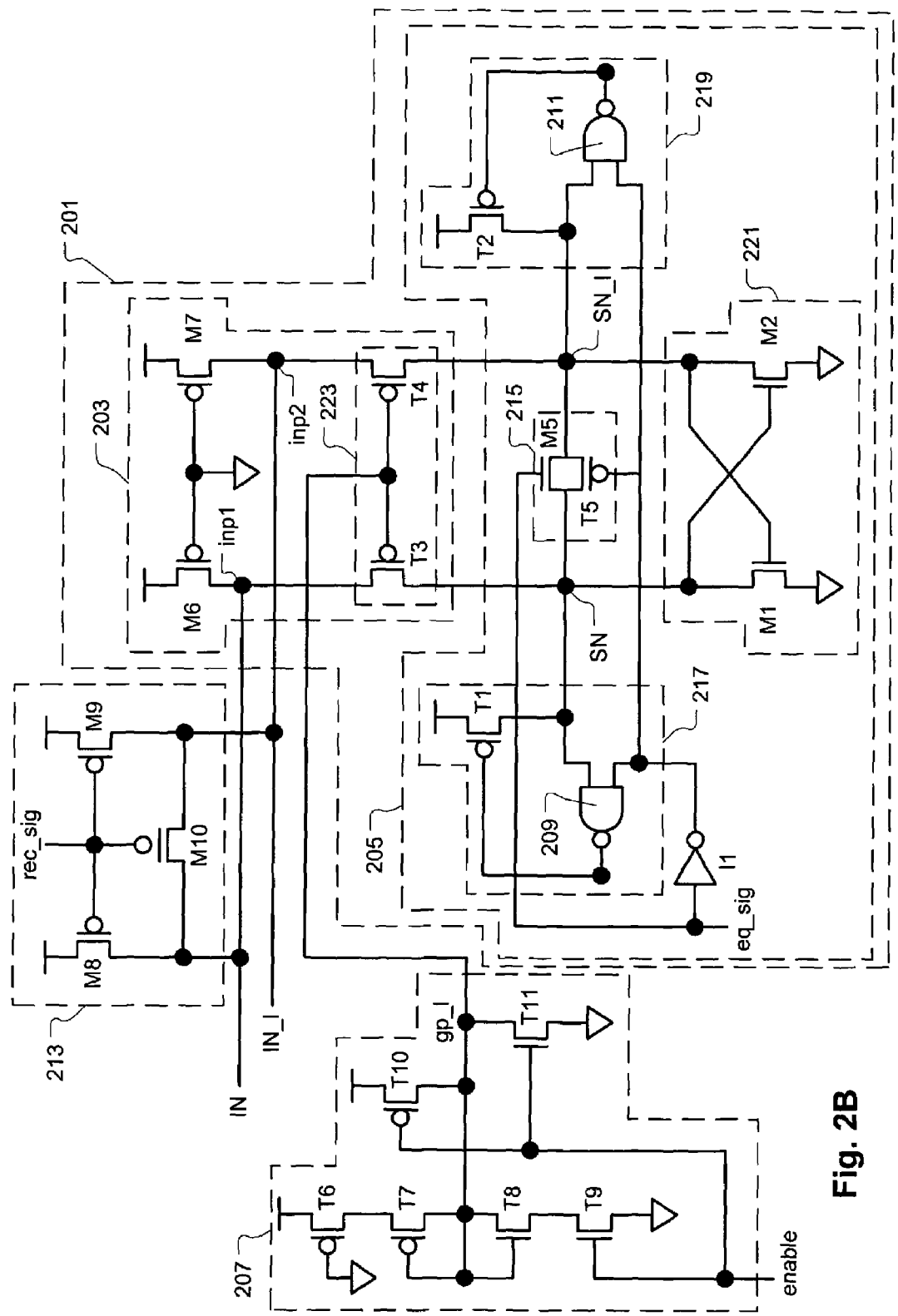
FIG. 2B is an illustration showing a more detailed representation of the sense amplifier of FIG. 2A, in accordance with one embodiment of the present invention.

FIG. 2B is an illustration showing a more detailed representation of the sense amplifier 201 of FIG. 2A, in accordance with one embodiment of the present invention. The input stage 203 includes PMOS devices M6 and M7, each having an input connected to a supply voltage and a gate commonly connected to ground. The PMOS devices M6 and M7 serve to apply a steady voltage to input nodes inp1 and inp2, respectively. The input nodes inp1 and inp2 are connected to receive the differential pair of input signals IN and IN_1 into the sense amplifier 201.

The balanced isolation devices 223 of the input stage 203 include two PMOS devices T3 and T4 whose inputs are connected to input nodes inp1 and inp2, respectively. The gates of PMOS devices T3 and T4 are commonly biased through connection to the bias generator circuit 207. The outputs of PMOS devices T3 and T4 are connected to sense nodes SN and SN_1, respectively. Since the gates of PMOS devices T3 and T4 are equally biased, the configuration of the PMOS devices T3 and T4 essentially eliminates an unbalanced threshold voltage ($V_{th}$) shift that can result from NBTI.

As discussed with respect to FIG. 2A, the sense nodes SN and SN_1 reside within the sense stage 205 along with the interposed transmission gate 215. In one embodiment, the transmission gate 215 is defined by both an NMOS device M5 and a PMOS device T5. In alternate embodiments, the transmission gate 215 is defined by either the NMOS device M5 or the PMOS device T5. The transmission gate 215 serves to facilitate equalization of the sense nodes SN and SN_1 prior to performing a sensing operation. The transmission gate 215 also serves to isolate the sense nodes SN and SN_1 from each other during the sensing operation. The NMOS device M5 gate is connected to receive the equalization control signal eq_sig. The PMOS device T5 gate is connected to an inverter I1 which is in turn connected to receive the equalization control signal eq_sig. Thus, when the equalization control signal eq_sig is high, both the NMOS device M5 and the PMOS device T5 will be controlled to transmit. Therefore, a high equalization control signal eq_sig will allow sense nodes SN and SN_1 to equalize through NMOS device M5 and PMOS device T5. Conversely, a low equalization control signal eq_sig will deactivate both NMOS device M5 and PMOS device T5, causing sense nodes SN and SN_1 to be isolated from each other. Because the PMOS device T5 is able to transmit at lower voltages, the PMOS device T5 allows equalization of the sense nodes SN and SN_1 at lower voltage levels. For example, in one embodiment, the PMOS device T5 can be defined to conduct such that the sense nodes SN and SN_1 can be equalized at about 40% of the supply voltage level ($V_{dd}$). Therefore, implementation of the PMOS device T5 enables the sense amplifier 201 to operate at lower voltage levels.

The booster circuits 217 and 219 of the sense stage 205 include PMOS devices T1 and T2, respectively. An output of each PMOS device T1 and T2 is connected to one of sense nodes SN and SN_1, respectively. The gates of PMOS devices T1 and T2 are controlled such that PMOS devices T1 and T2 act as positive feedback devices for sense node SN and SN_1, respectively. More specifically, the gate of each PMOS device T1 and T2 is connected to an output of one of NAND gates 209 and 211, respectively. The NAND gate 209 has a first input connected to sense node SN and a second input connected to the output of inverter I1. Similarly, the NAND gate 211 has a first input connected to sense node SN_1 and a second input connected to the output of inverter I1. The output of inverter I1 represents a complement of the equalization control signal eq_sig. Prior to performing the sensing operation, the equalization control signal eq_sig is high, and the output of inverter I1 is a low signal. Thus, prior to performing the sensing operation, the second input to each of NAND gates 209 and 211 is a low signal. Consequently, regardless of the first input to each of NAND gates 209 and 211, prior to performing the sensing operation, the PMOS devices T1 and T2 are controlled to not transmit. During the sensing operation, however, the equalization control signal eq_sig is low and the output of inverter I1 is a high signal. Thus, during the sensing operation, the second input to each of NAND gates 209 and 211 is a high signal. In following, if SN represents a high signal during the sensing operation, the output of NAND gate 209 is a low signal serving to cause PMOS device T1 to transmit. Similarly, if SN_1 represents a high signal during the sensing operation, the output of NAND gate 211 is a low signal serving to cause PMOS device T2 to transmit. Thus, during the sensing operation, PMOS devices T1 and T2 serve as positive feedback devices to assist in a low-to-high state transition of sense nodes SN and SN_1, respectively. Furthermore, since activation of PMOS devices T1 and T2 follows a critical point of the sensing operation, a threshold voltage shift due to NBTI effects within either of PMOS devices T1 or T2 is not detrimental to the performance of the sense amplifier 201.

During the sensing operation, the pull down logic 221 of the sense stage 205 is configured such that sense nodes SN and SN_1 achieve mutually exclusive states. More specifically, a cross-coupled pair of NMOS devices M1 and M2 are provided within the pull down logic 221 to ensure that sense nodes SN and SN_1 achieve mutually exclusive states during the sensing operation. The inputs of NMOS devices M1 and M2 are connected to sense nodes SN and SN_1, respectively. However, the gates of NMOS devices M1 and M2 are connected to sense nodes SN_1 and SN, respectively. Thus, as sense node SN_1 begins to attain a higher state relative to sense node SN, NMOS device M1 will begin to transmit causing the state of SN to become lower. Conversely, as sense node SN begins to attain a higher state relative to sense node SN_1, NMOS device M2 will being to transmit causing the state of SN_1 to become lower. Therefore, NMOS devices M1 and M2 serve to pull down sense nodes SN and SN_1, respectively, as the complementary sense node begins to attain a higher state.

As previously mentioned, the gates of PMOS devices T3 and T4 of the balanced isolation devices 223 within the input stage 203 are commonly biased through connection to a node gp_1 within the bias generator circuit 207. In one embodiment, the bias generator circuit 207 is placed at a periphery of a memory cell array along with other control circuitry. It should be appreciated, however, that the bias generator circuit 207 can be placed at any suitable location so long as operational specifications of the sense amplifier 201 are not compromised. The bias generator circuit 207 includes PMOS devices T6 and T7 connected in series (i.e., output-to-input) from a supply voltage to the node gp_1. The gate of PMOS device T6 is connected to ground. The gate of PMOS device T7 is connected to node gp_1. Therefore, the gate and output of PMOS device T7 are connected to a common node, gp_1. The PMOS device T6 is configured to mirror the PMOS devices M6 and M7 of the input stage 203. Also, the PMOS device T7 is configured to mirror the PMOS devices T3 and T4 of the input stage 203. Thus, the PMOS devices T6 and T7 are configured to track the PMOS device combinations (M6 and T3)/(M7 and T4) even in layouts where the bias generator circuit 207 is physically separate from the sense amplifier 201.

The bias generator circuit 207 also includes NMOS devices T8 and T9 connected in series from node gp_1 to ground. The gate and input of NMOS device T8 are connected to a common node, gp_1. The gate of NMOS device T9 is connected to receive an enable input signal. Based on the configuration of devices T6, T7, T8, and T9, a high enable input signal will cause node gp_1 to maintain a voltage level that is about one-half of the supply voltage level ($V_{dd}$) applied to the input of the PMOS device T6. Furthermore, the voltage level of node gp_1 will be maintained within a range bounded by the threshold voltages of PMOS device T7 and NMOS device T8. Thus, PMOS device T7 and NMOS device T8 are incorporated to ensure that the node gp_1 voltage level will remain within a range in which the sense amplifier 201 is operational, accounting for process variations and supply voltage level variations.

In one embodiment, the bias generator circuit 207 also includes an auxiliary NMOS device T11 having an input connected to the node gp_1, an output connected to ground, and a gate connected to receive the enable input signal. Upon receiving a high enable input signal, the auxiliary NMOS device T11 serves to extend a lower bound of the voltage range within which the node gp_1 is maintained. The bias generator 207 also includes a PMOS device T10 having an input connected to the supply voltage, an output connected to the node gp_1, and a gate connected to receive the enable input signal. When the enable input signal is high, as previously discussed, the PMOS device T10 is inactive. However, when the enable input signal is low, the PMOS device T10 serves to lock the node gp_1 voltage at a high state while the remainder of the bias generator circuit 207 is effectively hibernated.

With reference to the sense amplifier 201, and more specifically to the balanced isolation devices 223 of the input stage 203, the node gp_1 of the bias generator circuit 207 serves as a common control for the gates of PMOS devices T3 and T4. Thus, when the enable input signal of the bias generator circuit 207 is low, i.e., prior to performing the sensing operation, the PMOS devices T3 and T4 are controlled to not transmit. When the enable input signal of the bias generator circuit 207 is high, i.e., during the sensing operation, the gates of PMOS devices T3 and T4 are commonly biased at a voltage level that is about one-half of the supply voltage level ($V_{dd}$). Furthermore, the voltage level applied to the gates of PMOS devices T3 and T4 is maintained within a range bounded by the threshold voltages of PMOS device T7 and NMOS device T8 (and NMOS device T11 if present). Generation of the $V_{dd}/2$ voltage level on the node gp_1 places the PMOS devices T3 and T4 in saturation mode. In saturation mode, PMOS devices T3 and T4 act as low impedance devices. Thus, in saturation mode, PMOS devices T3 and T4 function as voltage-to-current conversion devices. Also, since their gates are biased higher than their outputs, PMOS devices T3 and T4 function as isolation devices from a perspective of the sense nodes SN and SN_1, thus separating the high capacitance input nodes inp1 and inp2 from sense nodes SN and SN_1, respectively. Furthermore, decoupling of the high capacitance input nodes inp1 and inp2 from the sense nodes SN and SN_1, respectively, enables faster amplification of the sense nodes SN and SN_1.

In one embodiment, the sense amplifier 201 can be implemented in conjunction with the recovery stage 213. The recovery stage 213 serves to assist in recharging input connections leading to the input nodes inp1 and inp2 between sensing operations. The recovery stage 213 includes a pair of PMOS devices M8 and M9. Each of PMOS devices M8 and M9 have an input connected to the supply voltage ($V_{dd}$) and an output connected to a separate one of the input nodes inp1 and inp2. The recovery stage 213 also includes a bridging PMOS device M10 having each of its input/output terminals connected to a separate one of the outputs of PMOS devices M8 and M9. When activated, the bridging PMOS device M10 serves to equalize the charge present on the input nodes inp1 and inp2. The gates of PMOS devices M8, M9, and M10 are commonly connected to receive a recovery control signal rec_sig. A low recovery control signal rec_sig will cause each of PMOS devices M8, M9, and M10 to transmit. Thus, a low recovery control signal rec_sig will activate the recovery stage 213 to assist in recharging the input nodes inp1 and inp2. Conversely, a high recovery control signal rec_sig will deactivate the recovery stage 213, thus isolating the recovery stage 213 from the input nodes inp1 and inp2. It should be appreciated that the recovery stage 213 is not essential to the function of the sense amplifier 201, but is useful for more quickly recharging and equalizing the input nodes inp1 and inp2 between sensing operations.

Through commonly biasing the gates of the balanced isolation devices (i.e., PMOS devices T3 and T4) of the input stage 203, the sense amplifier 201 is configured to tolerate NBTI induced effects such as threshold voltage drift. Also, by implementing the PMOS device T5 in the transmission gate 215 of the sense stage 205, the sense amplifier 201 is capable of operating at lower supply voltage levels relative to conventional sense amplifiers.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A sense amplifier, comprising:
   an input stage having a pair of balanced isolation devices, each of the pair of balanced isolation devices having an input connected to receive a separate one of a pair of differential input signals, each of the pair of balanced isolation devices having a gate connected to receive a common bias voltage; and
   a sense stage having a pair of sense nodes connected to receive respective output signals from the pair of balanced isolation devices of the input stage, the sense stage being further configured to amplify a voltage of the received output signal having the higher voltage, wherein the sense stage includes a pair of booster circuits, each of the pair of booster circuits being configured to assist in a low-to-high state transition of a separate one of the pair of sense nodes during a sensing operation,
   wherein each of the pair of booster circuits includes,
   a NAND device connected to receive an equalization control signal as a first input and a state of the sense node to which the booster circuit is connected as a second input,
   a PMOS device having an input connected to a supply voltage and an output connected to the sense node to which the booster circuit is connected, the PMOS device having a gate connected to receive an output of the NAND device.

2. A sense amplifier as recited in claim 1, wherein the gates of the pair of balanced isolation devices are connected together to receive the common bias voltage.

3. A sense amplifier as recited in claim 1, wherein each of the pair of balanced isolation devices is defined as a PMOS device.

4. A sense amplifier as recited in claim 1, wherein the common bias voltage is provided by a bias generator circuit.

5. A sense amplifier as recited in claim 1, wherein the common bias voltage is maintain at a level that is about one-half of a supply voltage level.

6. A sense amplifier as recited in claim 1, wherein each of the pair of sense nodes is connected to an output of a separate one of the pair of balanced isolation devices of the input stage.

7. A sense amplifier as recited in claim 1, wherein the sense stage includes a transmission gate disposed between the pair of sense nodes, the transmission gate being configured to control electrical conduction between the pair of sense nodes, the transmission gate being further configured to operate in response to an equalization control signal.

8. A sense amplifier, comprising:
   a pair of input nodes connected to each receive a separate one of a pair of differential input signals;
   a pair of balanced isolation devices each having an input connected to a separate one of the pair of input nodes, the pair of balanced isolation devices each having a gate connected to receive a common bias voltage, the pair of balanced isolation devices each having an output representing a separate one of a pair of sense nodes;
   a transmission gate disposed between the pair of sense nodes, the transmission gate being configured to control conduction between the pair of sense nodes;
   pull down logic being connected to the pair of sense nodes;
   a pair of booster devices configured to assist a low-to-high state transition of a respective one of the pair of sense nodes during a sensing operation; and
   a recovery stage configured to assist charging and equalizing the pair of input nodes prior to activating the sense amplifier to perform a sensing operation.

9. A sense amplifier as recited in claim 8, wherein each of the pair of balanced isolation devices is a PMOS device.

10. A sense amplifier as recited in claim 8, wherein the transmission gate includes a PMOS device having a first terminal connected to one of the pair of sense nodes and a second terminal connected to the other of the pair of sense nodes, the transmission gate PMOS device having a gate connected to receive an equalization control signal.

11. A sense amplifier as recited in claim 8, wherein each of the pair of booster devices includes,
   a NAND device connected to receive an equalization control signal as a first input and a state of the sense node to which the booster device is connected as a second input,
   a PMOS device having an input connected to a supply voltage and an output connected to the sense node to which the booster device is connected, the PMOS device having a gate connected to receive an output of the NAND device,
   wherein receipt of a low equalization control signal causes the output of the NAND device to maintain a high state such that the PMOS device is controlled to not transmit, receipt of a high equalization control signal causing the output of the NAND device to attain a state opposite from a state of the sense node to which the booster device is connected.

12. A sense amplifier as recited in claim 8, further comprising:
a bias generator configured to supply the common bias voltage to the gates of the pair of balanced isolation devices.

13. A sense amplifier as recited in claim 12, wherein the bias generator is configured to maintain the common bias voltage at about one-half of a supply voltage level.

14. A sense amplifier as recited in claim 8, wherein the pull down logic includes a pair of NMOS devices each having an input connected to a separate one of the pair of sense nodes, each of the pair of NMOS devices having a gate connected to the input of the other one of the pair of NMOS devices, each of the pair of NMOS devices having an output connected to ground.

15. A method for making a sense amplifier, comprising:
connecting a pair of input nodes to each receive a separate one of a pair of differential input signals;
connecting an input of each of a pair of balanced isolation devices to a separate one of the pair of input nodes, wherein each of the pair of balanced isolation devices has an output representing a separate one of a pair of sense nodes;
connecting a gate of each of the pair of balanced isolation devices to receive a common bias voltage;
connecting each of a first terminal and a second terminal of a transmission gate to a separate one of the pair of sense nodes;
connecting pull down circuitry to the pair of sense nodes;
connecting each of a pair of booster devices to a separate one of the pair of sense nodes, each of the pair of booster devices being configured to assist a low-to-high state transition of the sense node to which the booster device is connected during a sensing operation; and
connecting a recovery stage to the pair of input nodes, wherein the recovery stage is defined to assist in charging and equalizing the pair of input nodes prior to activating the sense amplifier to perform a sensing operation.

16. A method for making a sense amplifier as recited in claim 15, wherein each of the pair of balanced isolation devices is defined as a PMOS device.

17. A method for making a sense amplifier as recited in claim 15, wherein the transmission gate is defined as a PMOS device.

18. A method for making a sense amplifier as recited in claim 17, further comprising:
connecting a gate of the PMOS device of the transmission gate to receive an equalization control signal.

19. A method for making a sense amplifier as recited in claim 15, wherein connecting each of the pair of booster devices to the separate one of the pair of sense nodes includes,
connecting a first input of a NAND device to receive an equalization control signal,
connecting a second input of the NAND device to receive a state of the sense node to which the booster device is connected,
connecting an input of a PMOS device to a supply voltage,
connecting an output of the PMOS device to the sense node to which the booster device is connected, and
connecting a gate of the PMOS device to receive an output of the NAND device.

20. A method for making a sense amplifier as recited in claim 15, further comprising:
connecting an output of each of a pair of PMOS devices to a separate one of the pair of input nodes;
connecting an input of each of the pair of PMOS devices to a supply voltage; and
connecting a gate of each of the pair of PMOS devices to a ground.

21. A method for making a sense amplifier as recited in claim 15, further comprising:
connecting a bias generator to supply the common bias voltage to the gates of the pair of balanced isolation devices, wherein the bias generator is defined to maintain the common bias voltage at about one-half of a supply voltage level.

22. A method for making a sense amplifier as recited in claim 15, wherein connecting pull down circuitry to the pair of sense nodes includes,
connecting an input of each of a pair of NMOS devices to a separate one of the pair of sense nodes,
connecting an output of each of the pair of NMOS devices to a ground, and
connecting a gate of each of the pair of NMOS devices to the input of the other one of the pair of NMOS devices.

* * * * *